United States Patent
Hu

(10) Patent No.: US 9,838,016 B1
(45) Date of Patent: Dec. 5, 2017

(54) ADAPTIVE HIGH-SPEED CURRENT-STEERING LOGIC (HCSL) DRIVERS

(71) Applicant: Integrated Device Technology, Inc., San Jose, CA (US)

(72) Inventor: Pengfei Hu, Chandler, AZ (US)

(73) Assignee: Integrated Device Technology, Inc., San Jose, CA (US)

( * ) Notice: Subject to any disclaimer, the term of this patent is extended or adjusted under 35 U.S.C. 154(b) by 37 days.

(21) Appl. No.: 15/050,646

(22) Filed: Feb. 23, 2016

(51) Int. Cl.
*H03K 19/0175* (2006.01)
*H03K 19/0185* (2006.01)

(52) U.S. Cl.
CPC .................. *H03K 19/018514* (2013.01)

(58) Field of Classification Search
CPC ............. H04L 25/0278; H03F 3/45112; H03F 3/45121; H03F 3/45654; H03F 3/45717
USPC ............... 326/82–92, 115; 327/109
See application file for complete search history.

(56) References Cited

U.S. PATENT DOCUMENTS

| | | | | |
|---|---|---|---|---|
| 6,847,232 B2 * | 1/2005 | Tinsley | .......... | H03K 19/017527 326/84 |
| 6,853,220 B2 * | 2/2005 | De Laurentiis | ...... | H03G 1/0029 327/108 |
| 7,075,369 B2 * | 7/2006 | Takenaka | ............ | H03F 3/45183 330/254 |
| 7,342,420 B2 * | 3/2008 | Isik | ................ | H03K 19/018521 326/115 |
| 7,821,297 B2 | 10/2010 | Isik et al. | | |
| 7,830,177 B2 | 11/2010 | Isik et al. | | |
| 7,898,295 B1 * | 3/2011 | Kasturirangan | ..... | H03K 17/165 326/30 |
| 7,924,056 B2 * | 4/2011 | Kumar | ........... | H03K 19/018528 326/115 |
| 8,823,414 B2 * | 9/2014 | Thirugnanam | | H03K 19/018514 326/127 |

(Continued)

OTHER PUBLICATIONS

"Low-Power HCSL vs. Traditional HCSL", Integrated Device Tecnhology, © 2015, Apr. 2, 2015, 5 pages.
(Continued)

*Primary Examiner* — Alexander H Taningco
*Assistant Examiner* — Nelson Correa
(74) *Attorney, Agent, or Firm* — Myers Bigel, P.A.

(57) ABSTRACT

A packaged integrated circuit device includes a first driver, which has a first pair of differential output terminals and a first common-mode sensing terminal, and a second driver, which has a second pair of differential output terminals and a second common-mode sensing terminal. The second driver can be a smaller scaled replica of the first driver. A comparator and a reference signal generator are provided. The comparator is configured to compare first and second common-mode voltage signals developed at the first and second common-mode sensing terminals, respectively, and the reference signal generator is configured to provide the first and second drivers with a reference voltage having a magnitude that varies in response to changes in a signal generated at an output terminal of the comparator. This variation in the magnitude of the reference voltage supports a built-in adaptive response to changes in source-side termination in HCSL driver/receiver circuits.

16 Claims, 4 Drawing Sheets

(56) References Cited

U.S. PATENT DOCUMENTS 9,407,268 B1 * 8/2016 Hsu ................ H03K 19/018528

OTHER PUBLICATIONS

"Output Terminations for SiT9102/9002/9107 LVPECL, LVDS, CML, and HCSL Differential Drivers", The Smart Timing Choice™, Oct. 2013, 18 pages.

* cited by examiner

ADAPTIVE HIGH-SPEED CURRENT-STEERING LOGIC (HCSL) DRIVERS

FIELD OF THE INVENTION

The present invention relates to integrated circuit devices and driver circuits therein and, more particularly, to integrated circuit devices containing driver circuits with current steering logic.

BACKGROUND OF THE INVENTION

Conventional high-speed current-steering logic (HCSL) drivers can steer a constant current (e.g., 15 mA) between true and complementary outputs of a differential pair. As shown by the HCSL driver/receiver circuit 10a of FIG. 1A, traditional HCSL "end" termination uses a 50Ω resistor (RT) to ground at the end of each differential printed circuit board (PCB) trace. In contrast, the HCSL driver/receiver circuit 10b of FIG. 1B illustrates a type of "source" termination, which places the 50Ω resistors (RT) to ground nearer the HCSL driver (i.e., the drive "source"). As will be understood by those skilled in the art, this type of "source" termination allows for differential signals (e.g., clock signals) to pass through connectors that can be unplugged while the circuit is active, which is a type of "hot swapping." As further shown by FIGS. 1A-1B, traditional HCSL drivers typically need to include a pair of 33Ω series resistors (RS) to inhibit signal reflection and ringing between the driver and the 50Ω PCB termination traces.

Referring now to FIG. 2, a conventional HCSL driver 20 is typically provided within a packaged integrated circuit device 22 having a plurality of external pins (e.g., P1, P2). As shown, the HCSL driver 20 includes a differential pre-driver 23, which generates a pair of differential output signals in response to a pair of differential input signals IN and /IN, and a differential main driver containing differential PMOS input transistors (M1, M2), which steer a bias current provided by a PMOS pull-up transistor M0 to off-chip loading resistors R1-R4, where R1-R2 (i.e., RT) are typically matched at 50Ω and R3-R4 (i.e., RS) are typically matched at 33Ω. As will be understood by those skilled in the art, a pair of resistors R5/R6 operate to sense the common-mode level of the two external pins P1, P2 and feed this common-mode level to a positive input port of an operational amplifier 25. This common-mode level is compared with a reference voltage (Vref), which is typically generated by a bandgap reference circuit (not shown), and the result of the comparison (at the output of the operational amplifier) is provided as a bias control signal to a gate terminal of the PMOS pull-up transistor M0. Based on this configuration, the operational amplifier operates within a negative feedback loop to regulate the common-mode level to the level of Vref.

SUMMARY OF THE INVENTION

An integrated circuit device according to embodiments of the invention can include a first driver, which has a first pair of differential output terminals and a first common-mode sensing terminal associated with the first pair of differential output terminals, and a second driver, which has a second pair of differential output terminals and a second common-mode sensing terminal associated with the second pair of differential output terminals. A comparator and a reference signal generator can also be provided. The comparator is configured to compare first and second common-mode voltage signals developed at the first and second common-mode sensing terminals, respectively, and the reference signal generator is configured to provide the first and second drivers with a reference voltage having a magnitude that varies in response to changes in a signal generated at an output terminal of the comparator.

According to some of these embodiments of the invention, the second driver is configured as a smaller scaled replica of the first driver. A pre-driver may also be provided, which is configured to drive a first pair of differential input terminals associated with the first driver and a second pair of differential input terminals associated with the second driver with a first pair of differential input signals. This pre-driver and the first driver may operate collectively as a high-speed current-steering logic (HCSL) driver and the pre-driver and the second driver may operate collectively as a high-speed second current-steering logic (HCSL) driver.

According to further aspects of these embodiments of the invention, the reference signal generator is provided with a multiplexer having a control/selection terminal, which is responsive to the signal generated at the output terminal of the comparator, and first and second input terminals, which are responsive to unequal reference voltages. Based on this configuration, the reference voltage generated at an output terminal of the multiplexer will vary between relatively high and low voltage levels in response to low-to-high and high-to-low changes in the signal generated at the output terminal of the comparator.

According to additional embodiments of the invention, a packaged integrated circuit device is provided with first and second current-steering logic (CSL) drivers having unequal output drive characteristics. The first CSL driver has a first pair of differential output terminals, which are electrically coupled to a pair of differential output pins of the packaged integrated circuit device. A control circuit is provided, which is electrically coupled to the first and second CSL drivers. The control circuit is configured to adaptively adjust the output drive characteristics of the first CSL driver in response to detecting a resistance value of an external load electrically connected to the pair of differential output pins. In particular, the control circuit may be configured to adjust the common-mode level of the external load in response to comparing a sensed common-mode level of the external load relative to a sensed common-mode level of a reference load internal to the packaged integrated circuit device. This reference load is electrically coupled to the second CSL driver, which may be a smaller scaled replica of the first CSL driver.

A packaged integrated circuit device according to still further embodiments of the invention includes first and second current-steering logic (CSL) drivers having unequal output drive characteristics. The first CSL driver has a first pair of differential output terminals electrically coupled to a pair of differential output pins of the packaged integrated circuit device and the second CSL driver has a second pair of differential terminals electrically coupled to a reference load within the packaged integrated circuit device. A control circuit is also provided, which his electrically coupled to the first and second CSL drivers. The control circuit is configured to adjust the output drive characteristics of the first CSL driver in response to comparing a sensed common-mode level of an external load, which is electrically connected to the pair of differential output pins, to a sensed common-mode level of the reference load. This first CSL driver may include a first pair of equivalently-sized resistors electrically coupled in series across the first pair of differential output terminals, and the second CSL driver may include a second pair of equivalently-sized resistors electrically coupled in series across the second pair of differential terminals. A comparator may also be provided, which has first input terminal electrically coupled to the first pair of equivalently-sized resistors and a second input terminal electrically coupled to the second pair of equivalently-sized resistors. The control circuit may also include a multiplexer having a select terminal responsive to a signal developed at an output of the comparator.

DETAILED DESCRIPTION OF EMBODIMENTS

Figure 1A:
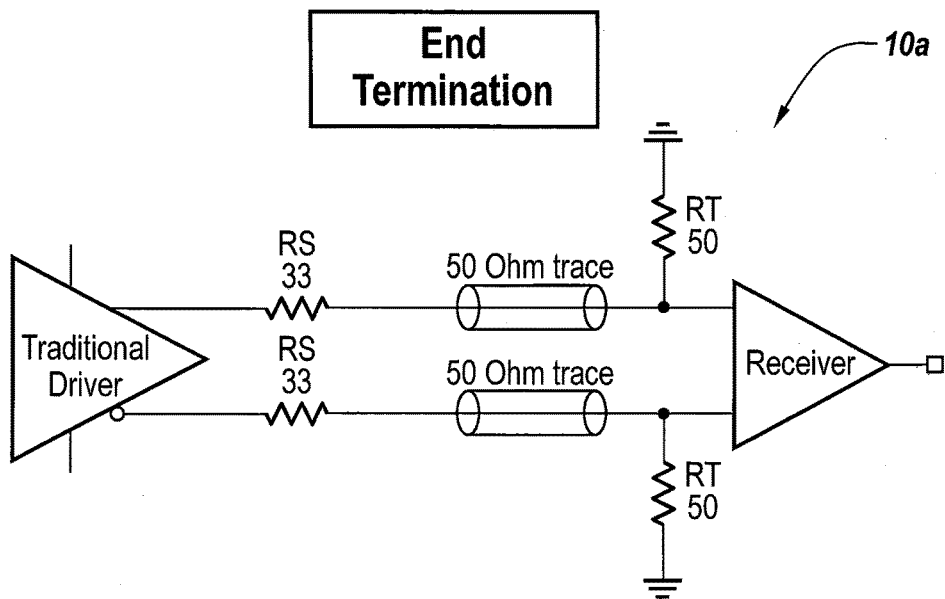
FIG. 1A is an electrical schematic of a conventional HCSL driver/receiver circuit that utilizes traditional "end" termination.
Figure 1B:
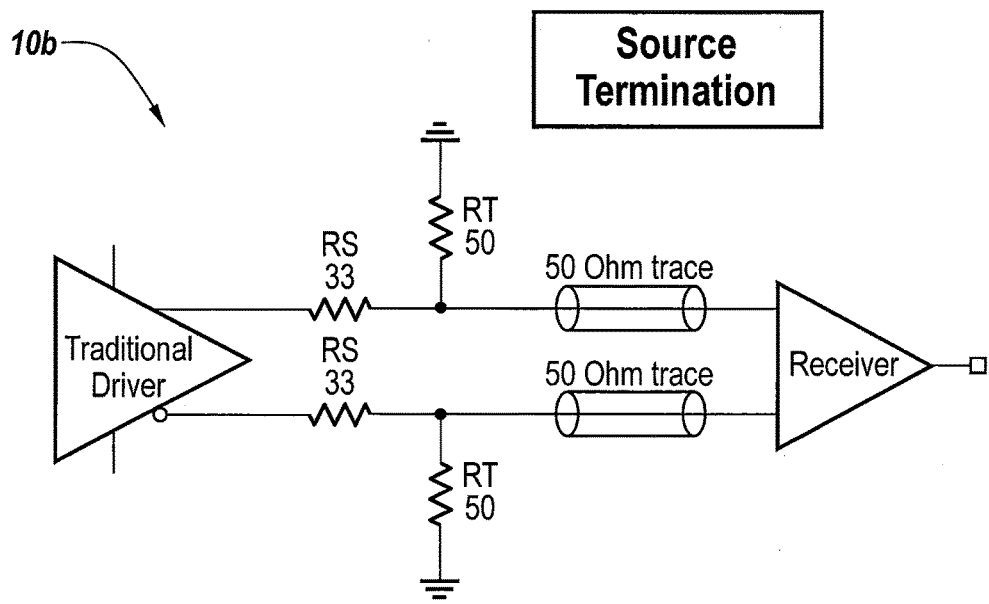
FIG. 1B is an electrical schematic of a conventional HCSL driver/receiver circuit that utilizes traditional "source" termination.
Figure 2:
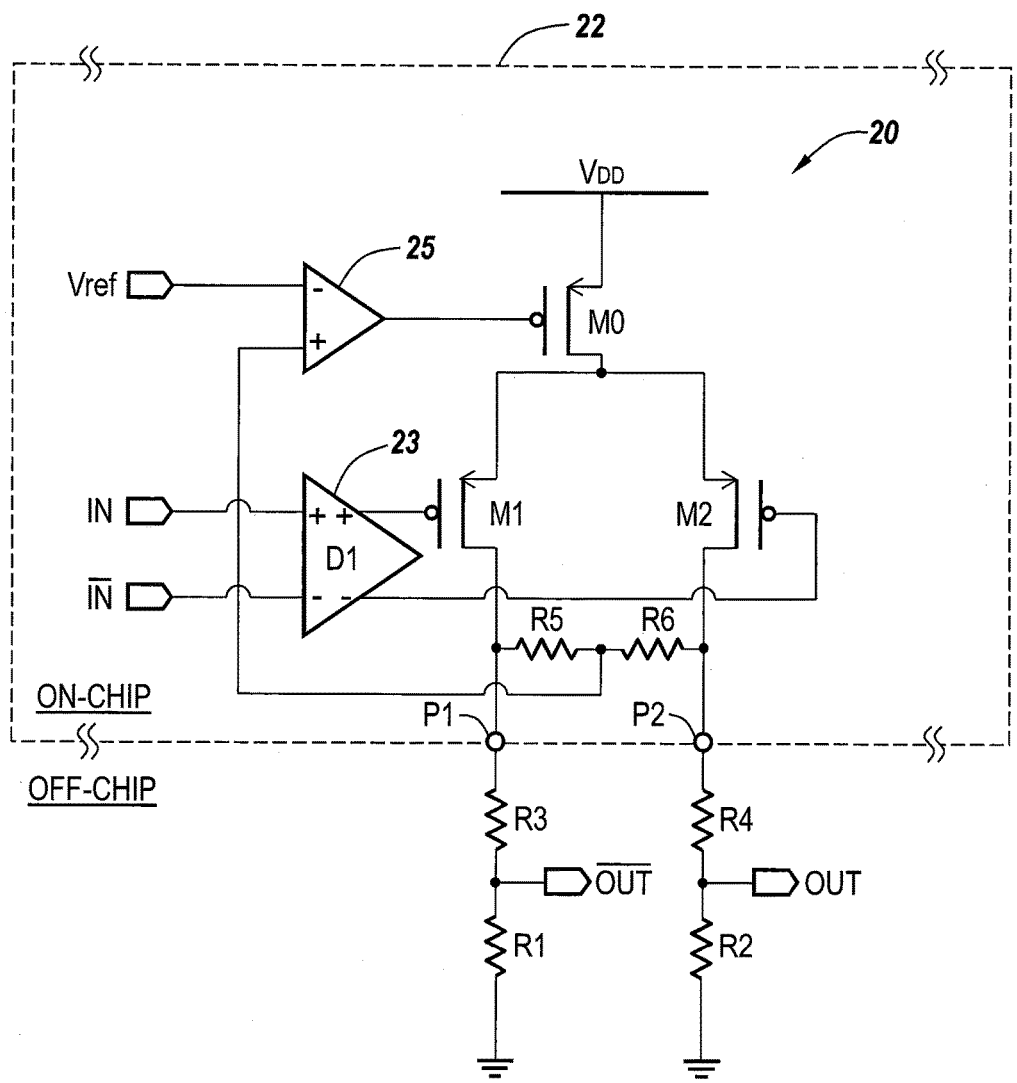
FIG. 2 is an electrical schematic of a conventional HCSL driver 20 of FIG. 1B, which supports common-mode level sensing using negative feedback.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3A:
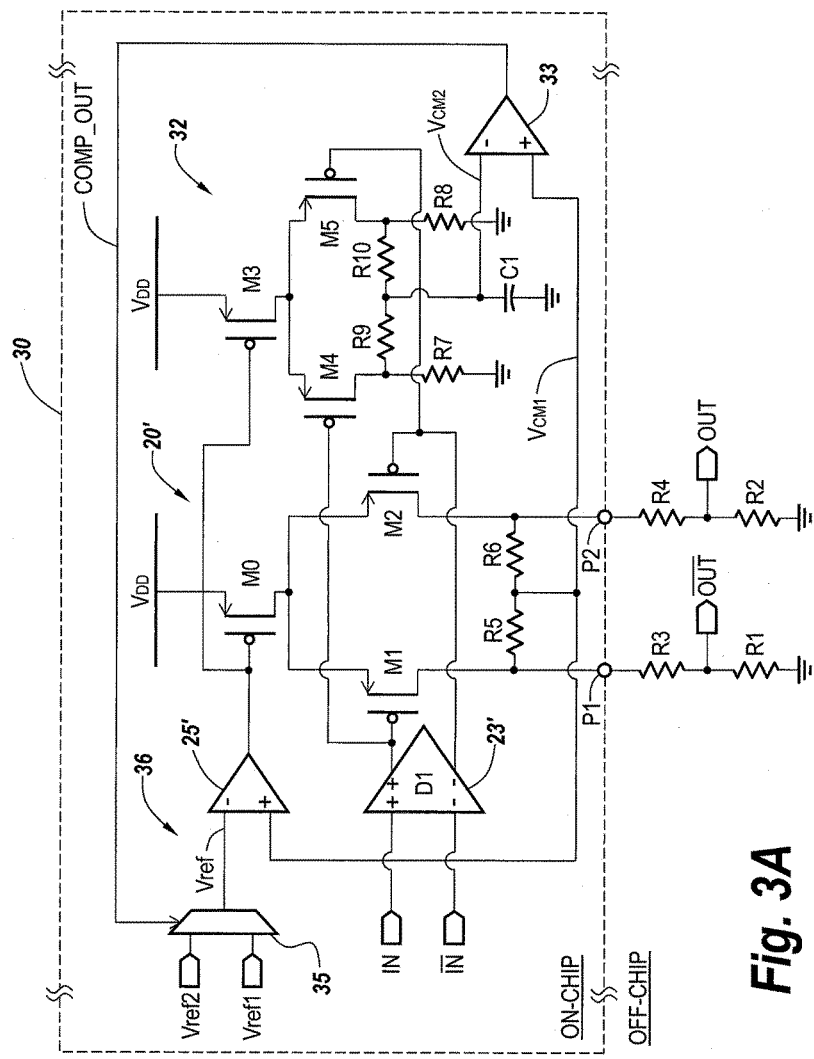
FIGS. 3A-3C are electrical schematics of an adaptive HCSL driver according to embodiments of the invention.

Referring now to FIG. 3A, an embodiment of a packaged integrated circuit device 30 according to embodiments of the invention is illustrated as including a first current-steering logic driver 20', a second current-steering logic driver 32, which may be configured as a smaller scaled "replica" of the first driver 20', and a differential pre-driver 23', which is responsive to a pair of differential input signal IN, /IN, such as internally generated clock signals CLK, /CLK. As shown, the first driver 20' includes a first pair of differential input terminals at the gate terminals of PMOS transistors M1 and M2 and a first pair of differential output terminals at the drain terminals of the PMOS transistors M1 and M2, which are electrically connected to a pair of output pins P1, P2 of the packaged integrated circuit device 30. The first driver 20' also includes a pair of common-mode measurement resistors R5, R6, which are electrically coupled in series across the output pins P1, P2 and electrically connected together at a first common-mode sensing terminal, which supports a first common-mode voltage $V_{CM1}$. Similarly, the second driver 32 includes a second pair of differential input terminals at the gate terminals of PMOS transistors M4 and M5 and a second pair of differential output terminals at the drain terminals of PMOS transistors M4 and M5, which are electrically connected to a pair of internal "termination" resistors R7, R8. The second driver 32 also includes a pair of common-mode measurement resistors R9, R10, which are electrically connected in series across the drain terminals of the PMOS transistors M4 and M5 and together at a second common-mode sensing terminal, which supports a second common-mode voltage $V_{CM2}$ that is stabilized against jitter by a capacitor C1. The magnitudes of resistors R5, R6, R9 and R10 may be selected to be greater than ten times (e.g., >10×) the magnitudes of R1-R4.

In some embodiments of the invention, the packaged integrated circuit device 30 may be configured by customers to include both pairs of "source-side" termination resistors, where RS=R3=R4=33Ω and RT=R1=R2=50Ω, or only a single pair of termination resistors, where RS=R3=R4=0. Yet, in both configurations, it is typically a necessary requirement that the common-mode voltage level associated with R1, R2 at the differential output terminals OUT, /OUT be the same, notwithstanding the fact that with R3=R4=33Ω, the common-mode voltage associated with R1, R2 will otherwise be about 40% lower relative to when R3=R4=0 for a non-adaptive HCSL driver.

To address this typical requirement, the second driver 32 is provided along with a comparator 33 and a reference signal generator 36 to support operations to "detect" whether R3=R4=33Ω or R3=R4=0 (i.e., R3, R4 are omitted) at the output pins P1, P2 and then, in response to the detection, automatically adjust the magnitude of the reference voltage Vref provided to the operational amplifier 25' to thereby support a total external load of 50Ω (R1, R2 only) or 83Ω (R3, R4 included). This automatic adjustment is performed without requiring pre-programming by a customer and/or the inclusion of additional pins on the packaged device. Moreover, according to additional preferred aspects of these embodiments, the PMOS transistors M3-M5 are configured as "replicas" of M0-M2, but scaled to significantly smaller sizes to save power and reduce loading on the pre-driver 23', which drives the gate terminals of PMOS transistors M1-M2 and M4-M5 with differential input signals. For example, the PMOS transistors M3-M5 may be scaled downward in size by a factor ten (10) or more.

As shown by FIG. 3A, the comparator 33 is configured to generate a comparison output signal COMP_OUT as a feedback signal, in response to comparing the first and second common-mode voltage signals $V_{CM1}$, $V_{CM2}$ developed at the first and second common-mode sensing terminals, respectively. This comparison output signal COMP_OUT is provided as a control/select signal to a two-input multiplexer 35 within the reference signal generator 36. The magnitude of this comparison output signal COMP_OUT (e.g., "0" or "1" (i.e., 0V or 3.3V)) determines whether a first reference voltage Vref1 (e.g., 800 mV) or a second reference voltage Vref2 (e.g., 1326 mV) is provided as a reference voltage Vref to a first input terminal (−) of an operational amplifier 25', which drives the gate terminals of PMOS pull-up transistors M0, M3. Based on this configuration, the operational amplifier 25' performs a negative feedback comparison operation that drives the first common-mode voltage $V_{CM1}$ to the level of Vref1 or Vref2, which as sets the appropriate common-mode level of termination resistors R1, R2 regardless of whether or not termination resistors R3, R4 are utilized by the customer.

Figure 3B:
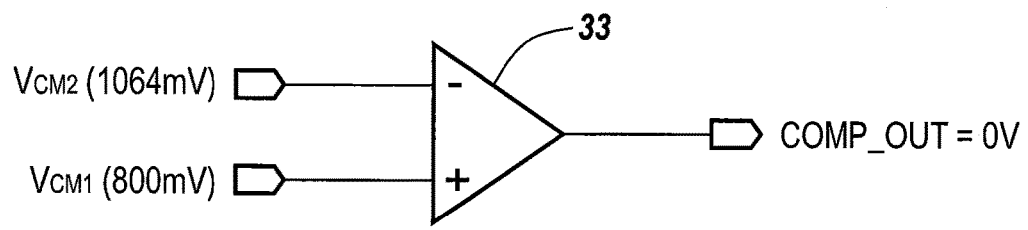
Figure 3C:
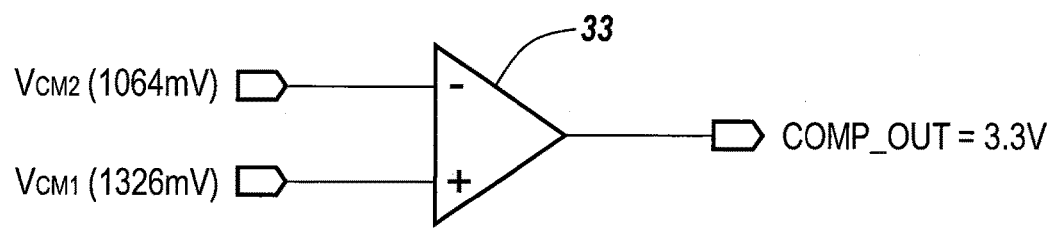

These adaptive operations to adjust the bias currents provided by the PMOS pull-up transistors M0, M3 (by controlling the magnitude of Vref) are facilitated by the proper choice of internal termination resistors R7, R8. For example, the resistors R7, R8 should be chosen so that the second common-mode sensing terminal supports a second common-mode voltage $V_{CM2}$ at an appropriate level. Preferably, $V_{CM2}$ is held at a level equal to about (Vref1+Vref2)/2, which is midway between the possible high and low values $V_{CM1}$. Accordingly, as shown by FIGS. 3B-3C, when $V_{CM1}$ transitions "low" to a level of about 800 mV to reflect RS=R3=R4=0 (and OUT=/OUT=800 mV), then COMP_OUT will be set/held at 0V. However, when $V_{CM1}$ transitions "high" to a level of about 1326 mV to reflect RS=R3=R4=33Ω (and OUT=/OUT=800 mV), then COMP_OUT will be set/held at 3.3V to thereby automatically adapt to changes in off-chip termination loading.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
   a first driver having a first pair of differential output terminals and a first common-mode sensing terminal associated with the first pair of differential output terminals;
   a second driver having a second pair of differential output terminals and a second common-mode sensing terminal associated with the second pair of differential output terminals;
   a comparator configured to compare first and second common-mode voltage signals developed at the first and second common-mode sensing terminals, respectively; and
   a reference signal generator configured to provide said first and second drivers with a reference voltage having a magnitude that varies in response to changes in a signal generated at an output terminal of said comparator.

2. The device of claim 1, wherein said second driver is a smaller scaled replica of said first driver.

3. The device of claim 2, further comprising a pre-driver configured to drive a first pair of differential input terminals associated with said first driver with a first pair of differential input signals; and wherein said pre-driver and first driver operate collectively as a current-steering logic (CSL) driver.

4. The device of claim 1, further comprising a pre-driver configured to drive a first pair of differential input terminals associated with said first driver with a first pair of differential input signals; and wherein said pre-driver and said first driver operate collectively as a first current-steering logic (CSL) driver.

5. The device of claim 4, wherein said second driver is also responsive to the first pair of differential input signals; and wherein said pre-driver and said second driver operate collectively as a second current-steering logic (CSL) driver.

6. The device of claim 1, wherein said reference signal generator comprises a multiplexer having a selection terminal responsive to the signal generated at the output terminal of said comparator and first and second input terminals responsive to unequal reference voltages.

7. The device of claim 1, further comprising a reference capacitor having a first terminal electrically coupled to the second common-mode sensing terminal.

8. The device of claim 1, wherein the reference voltage varies between relatively high and low voltage levels in response to low-to-high and high-to-low changes in the signal generated at the output terminal of said comparator.

9. The device of claim 1, further comprising an integrated circuit package containing said first and second drivers, comparator and reference signal generator; and wherein the first pair of differential output terminals are electrically coupled to respective output pins of the integrated circuit package but the second pair of differential output terminals are electrically decoupled from any pins of the integrated circuit package.

10. A packaged integrated circuit device, comprising:
   first and second current-steering logic (CSL) drivers having unequal output drive characteristics, said first CSL driver having a first pair of differential output terminals electrically coupled to a pair of differential output pins of the packaged integrated circuit device and said second CSL driver having a second pair of differential output terminals electrically coupled to a pair of common-mode measurement resistors within the packaged integrated circuit device; and
   a control circuit electrically coupled to said first and second CSL drivers, said control circuit configured to adaptively adjust the output drive characteristics of said first CSL driver in response to detecting a resistance value of an external load electrically connected to the pair of differential output pins, said adaptively adjusting the output drive characteristics of said first CSL driver including adjusting the common-mode level of the external load in response to comparing a sensed common-mode level of the external load relative to a sensed common-mode level of a reference load that is internal to the packaged integrated circuit device and electrically coupled to said second CSL driver.

11. The packaged integrated circuit device of claim 10, wherein the reference load comprises first and second resistors electrically connected to respective ones of the pair of common-mode measurement resistors.

12. The packaged integrated circuit device of claim 10, wherein said second CSL driver is a smaller scaled replica of said first CSL driver.

13. A packaged integrated circuit device, comprising:

first and second current-steering logic (CSL) drivers having unequal output drive characteristics, said first CSL driver having a first pair of differential output terminals electrically coupled to a pair of differential output pins of the packaged integrated circuit device and said second CSL driver having a second pair of differential terminals electrically coupled to a reference load within the packaged integrated circuit device; and a control circuit electrically coupled to said first and second CSL drivers, said control circuit configured to adjust the output drive characteristics of said first CSL driver in response to comparing a sensed common-mode level of an external load, which is electrically connected to the pair of differential output pins, to a sensed common-mode level of the reference load.

14. The packaged integrated circuit device of claim 13, wherein said first CSL driver comprises a first pair of equivalently-sized resistors electrically coupled in series across the first pair of differential output terminals; wherein said second CSL driver comprises a second pair of equivalently-sized resistors electrically coupled in series across the second pair of differential terminals; and wherein said control circuit comprises a comparator having a first input terminal electrically coupled to the first pair of equivalently-sized resistors and a second input terminal electrically coupled to the second pair of equivalently-sized resistors.

15. The packaged integrated circuit device of claim 14, wherein said control circuit comprises a multiplexer having a select terminal responsive to a signal developed at an output of the comparator.

16. The packaged integrated circuit device of claim 14, further comprising a pre-driver having a pair of differential output terminals electrically coupled to said first and second CSL drivers.

* * * * *